US012652038B2

(12) United States Patent
Pulvirenti et al.

(10) Patent No.: US 12,652,038 B2
(45) Date of Patent: Jun. 9, 2026

(54) BUFFER CIRCUIT FOR DRIVING A GAN POWER SWITCH AND CORRESPONDING DRIVER CIRCUIT

(71) Applicant: STMicroelectronics International N.V., Geneva (CH)

(72) Inventors: Francesco Pulvirenti, Acireale (IT); Salvatore Giuseppe Privitera, Paterno (IT); Cesare Bimbi, Paterno (IT)

(73) Assignee: STMicroelectronics International N.V., Geneva (CH)

( * ) Notice: Subject to any disclaimer, the term of this patent is extended or adjusted under 35 U.S.C. 154(b) by 64 days.

(21) Appl. No.: 18/604,239

(22) Filed: Mar. 13, 2024

(65) Prior Publication Data

US 2024/0322814 A1     Sep. 26, 2024

(30) Foreign Application Priority Data

Mar. 22, 2023    (IT) ......................... 102023000005412

(51) Int. Cl.
*H03K 17/16*        (2006.01)
*H03K 17/10*        (2006.01)
*H03K 17/687*       (2006.01)

(52) U.S. Cl.
CPC ......... *H03K 17/162* (2013.01); *H03K 17/102* (2013.01); *H03K 17/6872* (2013.01)

(58) Field of Classification Search
CPC .............. H03K 17/162; H03K 17/102; H03K 17/6872; H03K 17/166; H03K 17/6877; H03K 17/063; H03K 17/16; H03K 17/161; H02M 1/08
See application file for complete search history.

(56) References Cited

U.S. PATENT DOCUMENTS

| | | | | |
|---|---|---|---|---|
| 10,439,503 B1 * | 10/2019 | Kaya | ....................... | H02M 1/08 |
| 2019/0238129 A1 | 8/2019 | Fukushima et al. | | |
| 2020/0366182 A1 | 11/2020 | Bieber | | |

OTHER PUBLICATIONS

Kinzer, "GaN Power IC Technology: Past, Present, and Future", Proceedings of the 29th International Symposium on Power Semiconductor Devices & ICs, May 2017, 6 pages.
Xu et al., "Monolithic Integration of Gate Driver and Protection Modules With *P*-GaN Gate Power HEMTs", IEEE Transactions on Industrial Electronics, vol. 69, No. 7, Jul. 2022, pp. 6784-6793.

(Continued)

*Primary Examiner* — Jung Kim
(74) *Attorney, Agent, or Firm* — Seed IP Law Group LLP

(57)     ABSTRACT

A buffer circuit for driving a GaN power switch includes an input node to receive an input signal and an output node to produce a gate signal for the GaN power switch. The buffer includes a push-pull stage that includes a first transistor coupled between a supply voltage node and the output node, a second transistor coupled between the supply voltage node and the output node, a third transistor coupled between the output node and a reference voltage node, and a fourth transistor coupled between the output node and the reference voltage node. The buffer includes a pre-buffer stage configured to receive the input signal and to produce respective driving signals for the first, second, third and fourth transistors to produce the gate signal at the output node in four consecutive phases.

11 Claims, 5 Drawing Sheets

(56)                    References Cited

OTHER PUBLICATIONS

"High power density 600 V Half bridge driver with two enhancement mode GaNHEMT," MASTERGAN3, DS13724—Rev 1, www.st.com, May 2021. (30 pages).

"High power density 600 V half-bridge driver with two enhancement mode GaNHEMT," MASTERGAN5, DS13775—Rev 1, www.st.com, Jul. 2021. (26 pages).

"High power density 600V Half bridge driver with two enhancement mode GaN HEMT," MASTERGAN1, DS13417—Rev 3, www.st.com, Oct. 2020. (27 pages).

"High power density 600V Half bridge driver with two enhancement mode GaN HEMT," MASTERGAN2, DS13597—Rev 2.0, www.st.com, Jun. 2021. (29 pages).

"High power density 600V half-bridge driver with two enhancement mode GaN HEMT," MASTERGAN4, DS13686—Rev 1, www.st.com, Apr. 2021. (27 pages).

Basler et al., "Function Blocks of a Highly-Integrated All-in-GaN Power IC for DC-DC Conversion," EPE'22 ECCE Europe, 2022. (9 pages).

Chen, "GaN Smart Power Chip Technology," 2009 IEEE, pp. 403-407.

Cui et al., "Monolithic GaN Half-Bridge Stages With Integrated Gate Drivers for High Temperature DC-DC Buck Converters," *IEEE Access* 7:184375-184384, 2019.

Hanhart et al., "A Half-Bridge Gate-Driver for high-efficient Boost Converter Applications with the single-sided ZVS and an adaptive Ringing Suppression Technique," 2022 IEEE 48th European Solid State Circuits Conference (ESCIRC), pp. 289-292.

Kao et al., "Fully Integrated GaN-on-Silicon Gate Driver and GaN Switch With Temperature-Compensated Fast Turn-on Technique for Achieving Switching Frequency of 50 MHz and Slew Rate of 118.3 V/Ns," *IEEE Journal of Solid-State Circuits* 56(12):3619-3627, Dec. 2021.

Kaufmann et al., "A Monolithic GaN-IC With Integrated Control Loop for 400-V Offline Buck Operation Achieving 95.6% Peak Efficiency," *IEEE Journal of Solid-State Circuits* 55(12):3169-3178, Dec. 2020.

Liang et al., "Development of GaN Monolithic Integrated Circuits for Power Conversion," 2019 IEEE. (4 pages).

Maksimovic et al., "Monolithic Very High Frequency GaN Switched-Mode Power Converters," 2015 IEEE. (4 pages).

Pennisi et al., "Frequency Compensation Scheme for a Full GaN OpAmp driving 1-nF load," 2022 IEEE International Symposium on Circuits and Systems (ISCAS), pp. 2042-2046.

Sun et al., "All-GaN Power Integration: Devices to Functional Subcircuits and Converter ICs," *IEEE Journal of Emerging and Selected Topics in Power Electronics* 8(1):31-41, Mar. 2020.

Wang et al., "A GaN Pulse Width Modulation Integrated Circuit for GaN Power Converters," *IEEE Transactions on Electron Devices* 62(4):1143-1149, Apr. 2015.

Zhang et al., "A Smart Gate Driver IC for GaN Power HEMTs With Dynamic Ringing Suppression," *IEEE Transactions on Power Electronics* 36(12):14119-14132, Dec. 2021.

Zhang et al., "Very High Frequency PWM Buck Converters Using Monolithic GaN Half-Bridge Power Stages With Integrated Gate Drivers," *IEEE Transactions on Power Electronics* 31(11):7926-7942, Nov. 2016.

* cited by examiner

VBOOT

VS

24

VOUT

26

GNDL

23

VREGH

REGH

FF

224

225

226

VREGL

REGL

BD

223

227

22

VREG

REG1

222

220

221

VCC

VINH

VINL

GND

BUFFER CIRCUIT FOR DRIVING A GAN POWER SWITCH AND CORRESPONDING DRIVER CIRCUIT

BACKGROUND

Technical Field

The description relates to gate driver devices for high-voltage (HV) applications, in particular to gate driver devices implemented in monolithic Gallium Nitride (GaN) technology.

Such devices may be applied, for instance, in power converters (e.g., chargers, adapters, and the like) for use in various applications (e.g., automotive, industrial, consumer).

Description of the Related Art

Due to increasing energy demand worldwide, improving power conversion efficiency is a desirable feature. In addition, portable devices are becoming smaller and lighter, making heat dissipation more difficult. Research has thus recently focused on overcoming the limitations of conventional silicon-based devices to improve the performance of integrated electronic systems, with a trend towards power systems with smaller size, higher switching frequency, and lower power consumption.

A first step towards improved power conversion systems is represented by System-in-Package (SiP) solutions as exemplified in the circuit block diagram of FIG. 1, which shows a half-bridge power stage in a SiP that includes a high-voltage gate driver and a GaN High Electron Mobility Transistor (HEMT) totem-pole output stage, e.g., designed for 650 V output voltage. For instance, the devices available under the trade designation "MASTERGAN" with companies of the STMicroelectronics group (e.g., as described in the datasheets DS13417-Rev 3-October 2020, DS13597-Rev 2-June 2021, DS13686-Rev 1-April 2021, DS13724-Rev 1-May 2021 and DS13775-Rev 1-July 2021, all available at st.com), are examples of such SiP solutions. These SiP solutions, which embed gate drivers in silicon (Si) semiconductor technology and GaN power switches, improve the power conversion performance in a limited space thanks to improved interconnections between the gate driver Si die and the GaN power transistors. This results in reduced parasitic inductance of the gate loop, reduced critical ringing and associated overvoltage, higher switching frequency, reduced system size, weight and cost.

As exemplified in FIG. 1, a conventional power conversion SiP 10 includes a first (silicon-based) die 12 where a driver circuit is implemented in Si-BCD (Silicon Bipolar, CMOS and DMOS) technology, a second (GaN-on-Si-based) die 14 where the high-side GaN HEMT is implemented, and a third (GaN-on-Si-based) die 16 where the low-side GaN HEMT is implemented. The driver circuit 12 has an input supply node coupled to an input supply pad of SiP 10 to receive a supply voltage VCC, an input ground node coupled to an input ground pad of SiP 10 to receive a ground (or reference) voltage GND, an input high-side control node coupled to an input high-side control pad of SiP 10 to receive a high-side control signal VINH, and an input low-side control node coupled to an input low-side control pad of SiP 10 to receive a low-side control signal VINL. Signals VINH and VINL are buffered by respective buffers 120 and 121, and the buffered signals are passed to interlocking and protection circuitry 122 arranged between the supply line VCC and the ground line GND. A level shifter 123 shifts and passes the high-side control signal to a high-side output buffer 124, and a buffer 125 passes the low-side control signal to a low-side output buffer 126. A bootstrap diode BD has an anode terminal coupled to the input supply node VCC and a cathode terminal coupled to an output supply node to produce a bootstrap voltage VBOOT. An electrostatic discharge protection circuit 127 (ESD protection) has a first terminal coupled to the input ground node GND and a second terminal coupled to a power ground node PGND to reciprocally protect the two ground rails (GND and PGND) from electrostatic discharge (ESD). For instance, ESD circuit 127 may include a pair of anti-parallel diodes coupled between its terminals. It will be noted that ground nodes GND and PGND, which are independent and reciprocally protected by ESD protection circuit 127, represent respective reference terminals for two sections of the circuit, i.e., a signal section (referenced to GND) and a power section (referenced to PGND). The high-side output buffer 124 drives a high-side push-pull split-output stage 128 that produces a pair of driving signals (e.g., a turn-on signal and a turn-off signal) for the high-side HEMT 14. The low-side output buffer 126 drives a low-side push-pull split-output stage 129 that produces a pair of driving signals (e.g., a turn-on signal and a turn-off signal) for the low-side HEMT 16. The control (e.g., gate) terminal of the high-side HEMT 14 is coupled (e.g., via bonding wires or conductive tracks and resistors RGON, RGOFF embedded in the package of SiP 10) to the output nodes of the push-pull stage 128. The control (e.g., gate) terminal of the low-side HEMT 16 is coupled (e.g., via bonding wires or conductive tracks and resistors RGON, RGOFF embedded in the package of SiP 10) to the output nodes of the push-pull stage 129. The high-side HEMT 14 is coupled between a high-voltage supply pad VS of SiP 10 and an output pad VOUT of SiP 10, and the low-side HEMT 16 is coupled between the output pad VOUT and the power ground pad PGND of SiP 10, so that an output drive signal is produced at the output pad VOUT. The high-side output buffer 124 and the high-side push-pull stage 128 are supplied between the bootstrap voltage VBOOT and the output voltage VOUT (e.g., a floating ground). The low-side output buffer 126 and the low-side push-pull stage 129 are supplied between a power supply voltage PVCC and the power ground voltage PGND.

In addition to discrete power switching GaN devices, manufacturing processes for low-voltage transistor have been developed in GaN technology to allow the implementation of monolithic power integrated circuits, embedding both the gate driver and the power switches in the same substrate. The lateral structure of GaN technology offers the possibility of integrating multiple devices and additional function blocks on one die, which are typically designed in a comparable lateral technology such as Si-BCD. Thus, compared to the Si-based standalone gate drivers, integrated drivers reduce the parasitic inductance significantly, which can effectively suppress the ringing in the gate loop, and possibly enhance the reliability of GaN power switches.

However, the design of monolithic GaN integrated circuits presents some limitations due to the early-stage technologies that currently provide only n-channel enhancement-mode (e-mode) and depletion-mode (d-mode) transistors, and do not provide their complementary p-channel transistors, other than p-n junction diodes. The lack of complementary p-channel transistors is a challenge for the implementation of push-pull stages, which are otherwise straightforward in CMOS semiconductor technologies, with symmetrical rise and fall times. Moreover, the lack of complementary transistors may lead to an undesirable increase in static power consumption, especially in digital circuits.

As a result, high-speed logic circuits in GaN technology are currently power consuming and the technology is inefficient to implement complex digital functions. In addition, the design of integrated gate drivers for very high-frequency switching power converters relies on design techniques such as bootstrapping and active pull-up that increase circuitry complexity and static power consumption as well.

Within this framework, several monolithic gate drivers have been described in documents [1] to [9]: [1] Y. C. Liang, R. Sun, Y.-C. Yeo, and C. Zhao, "Development of GaN Monolithic Integrated Circuits for Power Conversion," 2019 *IEEE Custom Integrated Circuits Conference (CICC)*, Austin, TX, USA, 2019, pp. 1-4, doi: 10.1109/CICC.2019.8780294; [2] M. Cui et al., "Monolithic GaN Half-Bridge Stages with Integrated Gate Drivers for High Temperature DC-DC Buck Converters," *IEEE Access*, 2019, Vol. 7, pp. 184375-184384, doi: 10.1109/ACCESS.2019.2958059; [3] R. Sun et al., "All-GaN Power Integration: Devices to Functional Subcircuits and Converter ICs," *IEEE Journal of Emerging and Selected Topics in Power Electronics*, Vol. 8, No. 1, March 2020, pp. 31-41, doi: 10.1109/JESTPE.2019.2946418; [4] M. Kaufmann and B. Wicht, "A Monolithic GaN-IC With Integrated Control Loop for 400-V Offline Buck Operation Achieving 95.6% Peak Efficiency," *IEEE Journal of Solid-State Circuits*, Vol. 55, No. 12, December 2020, pp. 3169-3178, doi: 10.1109/JSSC.2020.3018404; [5] D. Maksimović, Y. Zhang, and M. Rodríguez, "Monolithic Very High Frequency GaN Switched-Mode Power Converters," In *Proc. of the* 2015 *IEEE Custom Integrated Circuits Conference (CICC)*, San Jose, CA, USA, Scp. 2015, pp. 1-4, doi: 10.1109/CICC.2015.7338386; [6] Y. Zhang, M. Rodríguez, and D. Maksimovic, "Very High Frequency PWM Buck Converters Using Monolithic GaN Half-Bridge Power Stages with Integrated Gate Drivers," *IEEE Transactions on Power Electronics*, Vol. 31, No. 11, November 2016, pp. 7926-7942, doi: 10.1109/TPEL.2015.2513058; [7] Y.-Y. Kao et al., "Fully Integrated GaN-on-Silicon Gate Driver and GaN Switch with Temperature-Compensated Fast Turn-on Technique for Achieving Switching Frequency of 50 MHz and Slew Rate of 118.3 V/Ns," *IEEE Journal of Solid-State Circuits*, Vol. 56, No. 12, December 2021, pp. 3619-3627, doi: 10.1109/JSSC.2021.3103875; [8] D. Kinzer, "GaN Power IC Technology: Past, Present and Future," In *Proc. of the* 29th *International Symposium on Power Semiconductor Devices & ICs* (ISPSD), Sapporo, Japan, 2017, pp. 19-24, doi: 10.23919/ISPSD.2017.7988981; [9] H. Xu et al., "Monolithic Integration of Gate Driver and Protection Modules With P—GaN Gate Power HEMTs," *IEEE Transactions on Industrial Electronics*, Vol. 69, No. 7, July 2022, pp. 6784-6793, doi: 10.1109/TIE.2021.3102387. However, these gate drivers have certain shortcomings, such as:

the drivers disclosed in documents [1], [2] and [3] do not provide rail-to-rail driving;
the driver disclosed in document [4] suffers from a voltage drop on the bootstrap diode;
the driver disclosed in document [5] relies on multiple power supply and utilizes a negative voltage;
the driver disclosed in document [6] utilizes a negative voltage; and
the driver disclosed in document [7] is complex insofar as it includes three bootstrap stages.

Additionally, comparators in GaN technology have been described in documents [10] to [12]: [10] K. J. Chen, "GaN Smart Power Chip Technology," 2009 *IEEE International Conference of Electron Devices and Solid-State Circuits* (EDSSC), Xi'an, China, 2009, pp. 403-407, doi: 10.1109/EDSSC.2009.5394230; [11] H. Wang, A. M. H. Kwan, Q. Jiang and K. J. Chen, "A GaN Pulse Width Modulation Integrated Circuit for GaN Power Converters," in *IEEE Transactions on Electron Devices*, vol. 62, no. 4, pp. 1143-1149 April 2015, doi: 10.1109/TED.2015.2396649; [12];

S. Pennisi, F. Pulvirenti and K. Samperi, "Frequency Compensation Scheme for a Full GaN OpAmp driving 1-nF load," 2022 *IEEE International Symposium on Circuits and Systems* (ISCAS), Austin, TX, USA, 2022, pp. 2042-2046, doi: 10.1109/ISCAS48785.2022.9938006. However, the comparator disclosed in document [10] has a limited output voltage range (not rail to rail), the comparator disclosed in document [11] has a limited supply voltage range, and the comparator disclosed in document [12] has a different architecture (an operational amplifier).

Therefore, there is a need in the art to provide fully integrated GaN driver circuits that improve the reliability, reduce the area and the packaging cost, and/or reduce (e.g., suppress) the parasitic inductances between the driver circuit and the power switches.

BRIEF SUMMARY

One or more embodiments contribute in providing such fully integrated GaN driver circuits, providing a high-speed and low-power gate driver implemented in a monolithic GaN technology on the same substrate with the power transistor(s).

One or more embodiments include a buffer circuit configured to drive a GaN power switch having the features set forth in the claims that follow.

One or more embodiments may relate to a corresponding driver circuit.

The claims are an integral part of the technical teaching provided herein in respect of the embodiments.

In one embodiment, a buffer circuit is configured to drive a GaN power switch. The buffer circuit includes an input node configured to receive an input signal and an output node configured to produce a gate signal for the GaN power switch. The buffer circuit includes a push-pull stage, which includes a first transistor and a second transistor having their conductive channels coupled between a supply voltage node and the output node, as well as a third transistor and a fourth transistor having their conductive channels coupled between the output node and a reference voltage node. The buffer circuit includes a pre-buffer stage configured to receive the input signal and to produce respective driving signals for the first, second, third and fourth transistors to produce the gate signal at the output node in four consecutive phases. In a first phase, the first transistor is conductive, and the second, third and fourth transistors are not conductive. In a second phase, the first and second transistors are conductive, and the third and fourth transistors are not conductive. In a third phase, the third transistor is conductive, and the first, second and fourth transistors are not conductive. In a fourth phase, the third and fourth transistors are conductive, and the first and second transistors are not conductive.

One or more embodiments may thus provide a high-speed and low-power gate driver configured to drive a power transistor, implemented in a monolithic GaN technology, with rail-to-rail driving and reduced power consumption.

In one embodiment, a driver circuit includes an input supply pad configured to receive a supply voltage, an input ground pad configured to receive a ground voltage, an input high-side control pad configured to receive a high-side control signal, an input low-side control pad configured to receive a low-side control signal, and an output pad configured to produce an output driving signal. A level shifter is configured to shift and pass the high-side control signal to a high-side output buffer circuit according to one or more embodiments. A low-side intermediate buffer circuit is configured to pass the low-side control signal to a low-side output buffer circuit according to one or more embodiments. A high-side GaN power transistor is arranged between a high-voltage supply pad and the output pad and is driven by the high-side output buffer circuit. A low-side GaN power transistor is arranged between the output pad and a protected ground pad and is driven by the low-side output buffer circuit.

In one embodiment, a method includes receiving an input signal at an input node of a buffer circuit of a driver circuit and generating a gate signal at an output node of the buffer circuit. Generating the gate signal includes in a first phase, rendering a first transistor conductive and rendering a second transistor, a third transistor, and a fourth transistor of the buffer circuit not conductive. A channel of the first transistor and a channel of the second transistor are each coupled between a supply voltage node and the output node, wherein a channel of the third transistor and a channel of the fourth transistor are each coupled between the output node a reference voltage node. Generating the gate signal includes in a second phase, rending the first and second transistors conductive and rendering the third and fourth transistors not conductive and in a third phase, rendering the third transistor conductive and rendering the first, second and fourth transistors not conductive. Generating the gate signal includes in a fourth phase, rendering the third and fourth transistors conductive and rendering the first and second transistors not conductive. The method includes driving a GaN power switch with the gate signal.

BRIEF DESCRIPTION OF THE SEVERAL VIEWS OF THE DRAWINGS

One or more embodiments will now be described, by way of example only, with reference to the annexed figures, wherein:

FIG. 1 is a circuit block diagram of a system-in-package, as has been described in the foregoing;

FIG. 2 is a circuit block diagram exemplary of a monolithic half-bridge power stage in GaN technology according to one or more embodiments of the present description;

DETAILED DESCRIPTION

Figure 3:
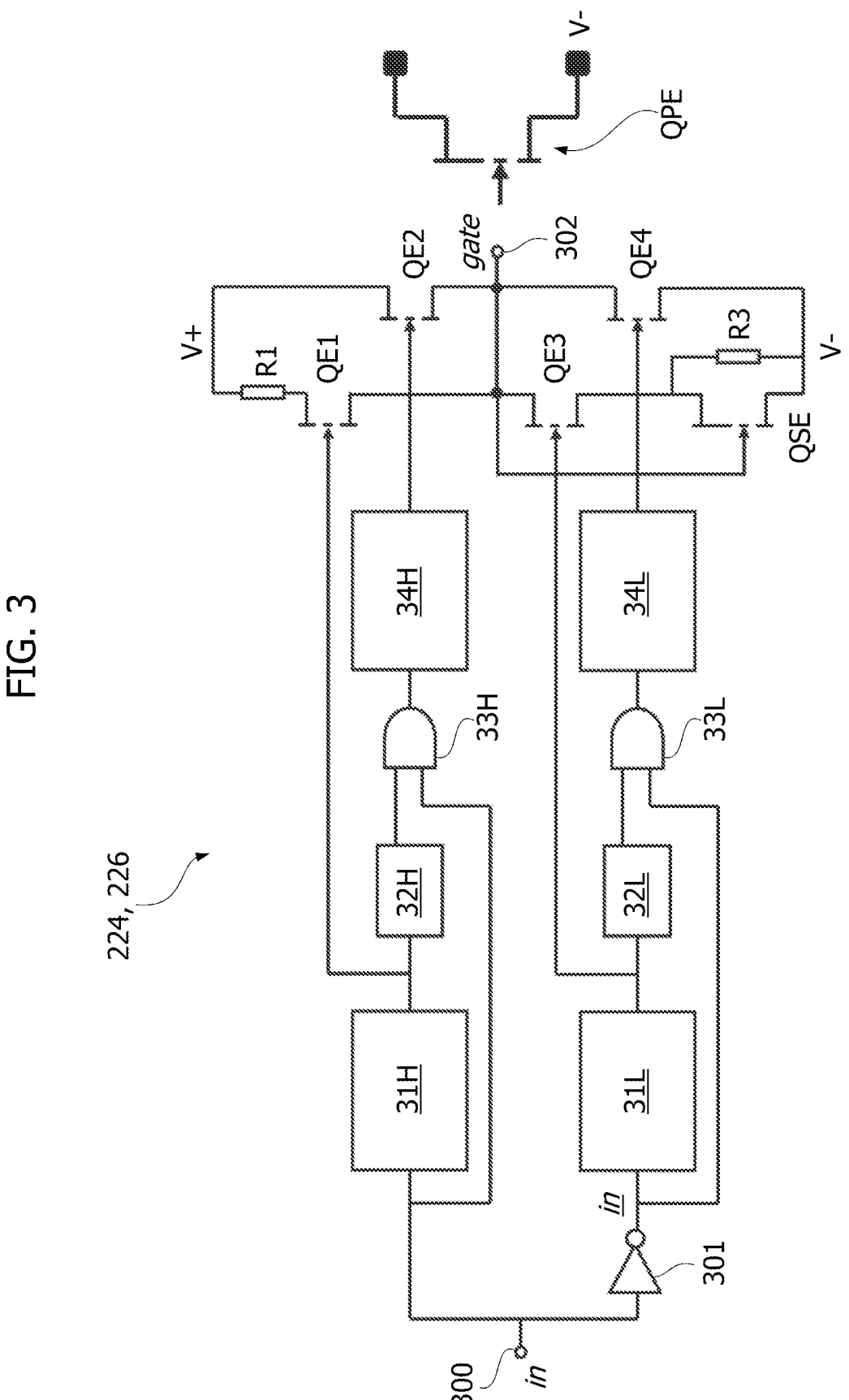
FIG. 3 is a circuit block diagram exemplary of a driver stage in GaN technology according to one or more embodiments of the present description.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

Figure 1:
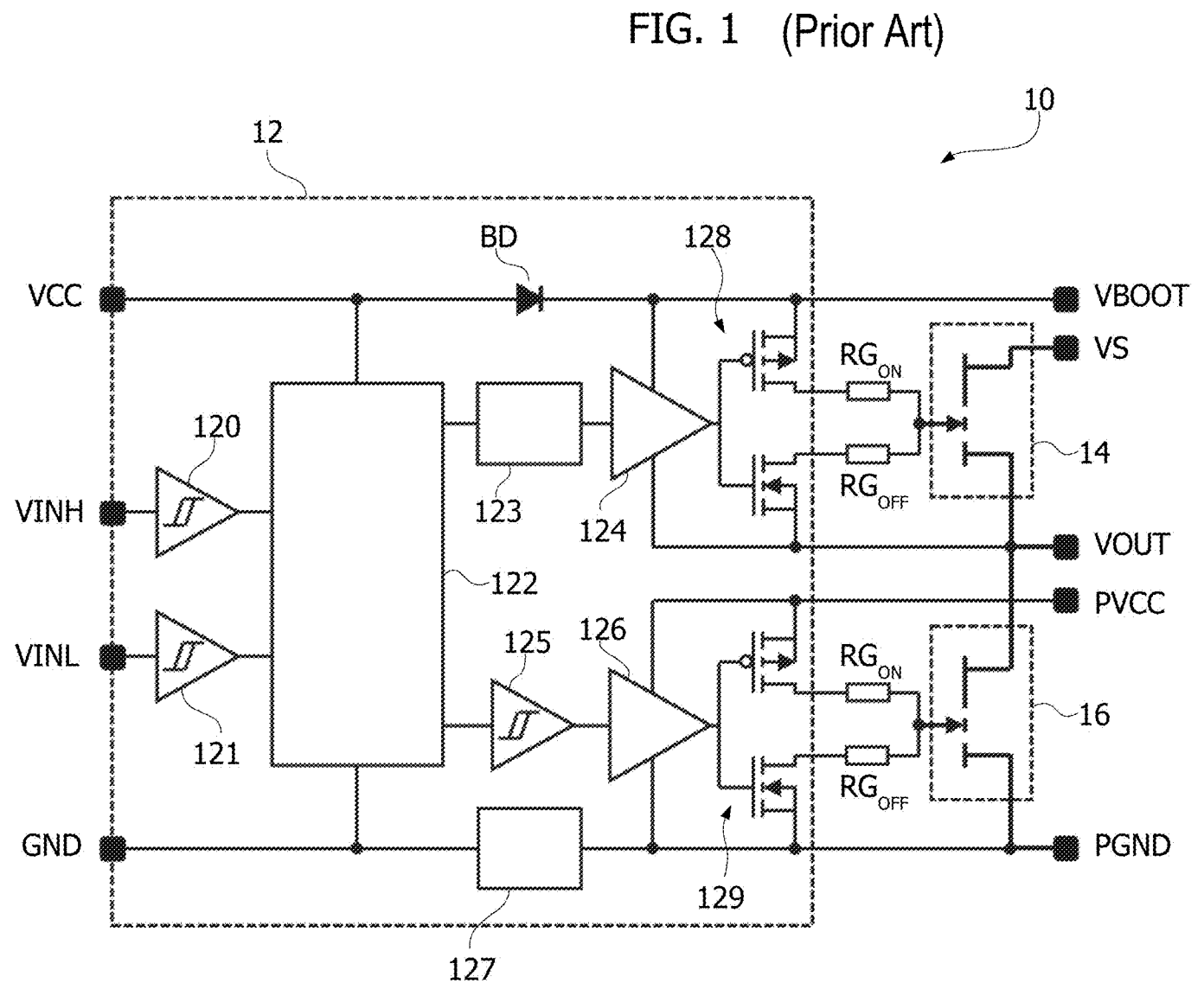
Figure 2:
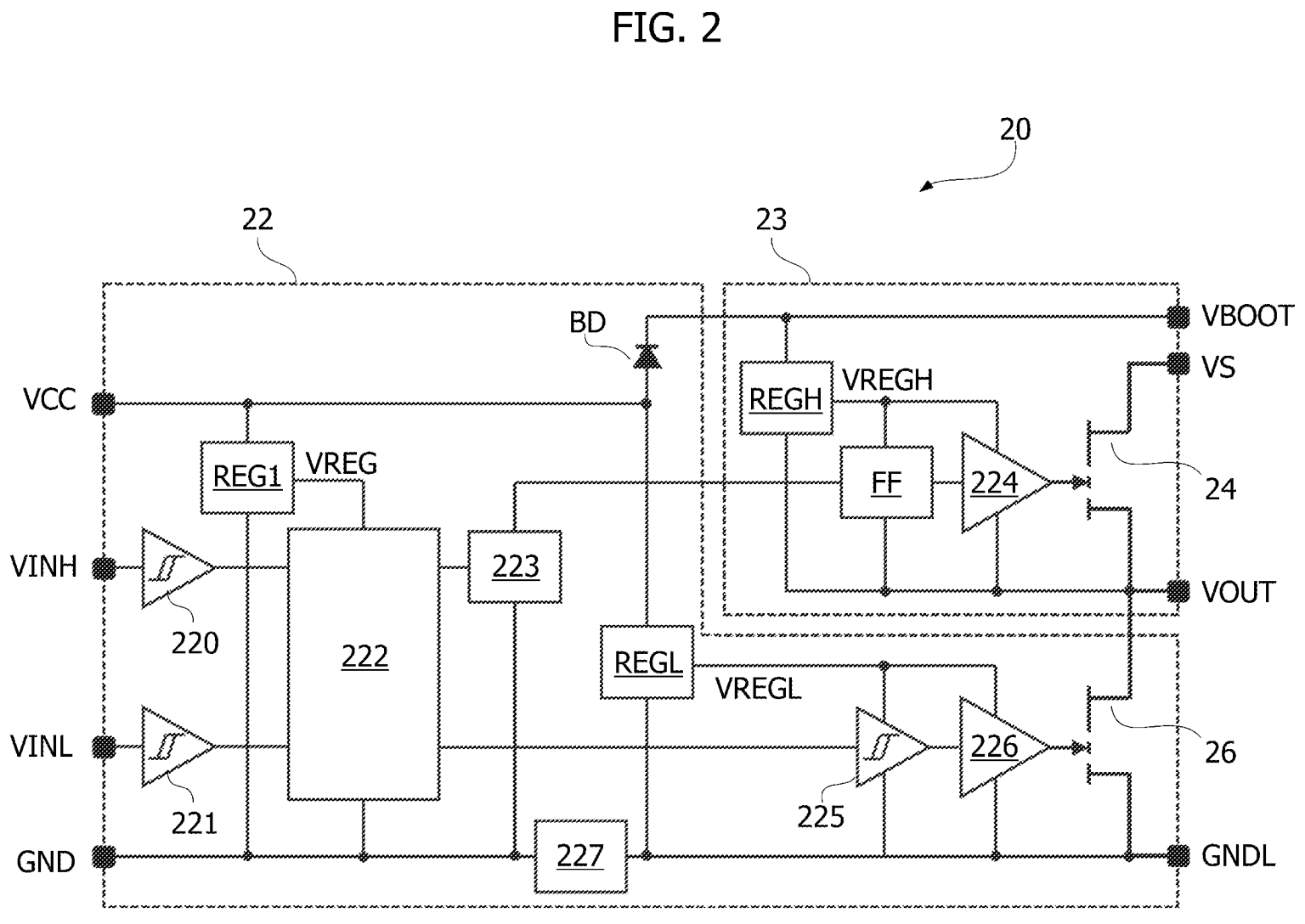

As anticipated, one or more embodiments relate to a fully integrated GaN driver circuit, e.g., incorporating a monolithic half-bridge power stage and the related driving circuitry in GaN technology (particularly, GaN-on-Si technology), as exemplified in the circuit block diagram of FIG. 2. The functionality of the circuit exemplified in FIG. 2 is similar to that of the SiP 10 exemplified in FIG. 1, but it is entirely implemented in GaN technology (on silicon substrate).

The fully integrated GaN driver circuit 20 has an input supply node coupled to an input supply pad to receive a supply voltage VCC, an input ground node coupled to an input ground pad to receive a ground (or reference) voltage GND, an input high-side control node coupled to an input high-side control pad to receive a high-side control signal VINH, and an input low-side control node coupled to an input low-side control pad to receive a low-side control signal VINL (e.g., signals VINH and VINL being PWM signals from an external microcontroller). Signals VINH and VINL are buffered by respective input buffers (e.g., comparators) 220 and 221, and the buffered signals are passed to an interlocking and protection circuit 222. Buffers 220 and 221 may implement hysteresis to improve stability of voltage transitions. The interlocking and protection circuit 222 is configured to shut down the power stage in the event of undervoltage and/or overtemperature, and to prevent both power switches of the half-bridge from turning on at the same time if both input signals VINH, VINL are inadvertently asserted (e.g., set to a high logic value) at the same time. A voltage regulator REGI (e.g., a low-dropout linear regulator) is arranged between the supply line VCC and the ground line GND and produces a regulated voltage VREG (e.g., stable and invariant with respect to temperature and supply voltage VCC). The interlocking and protection circuit 222 is supplied between the regulated voltage VREG and the ground voltage GND. A (e.g., high immunity) level shifter 223 shifts and passes the high-side control signal from circuit 222 to a flip-flop FF. The output from flip-flop FF is passed to a high-side output buffer circuit 224. A (e.g., high immunity) low-side intermediate buffer (e.g., comparator) 225 passes the low-side control signal from circuit 222 to a low-side output buffer circuit 226. Buffer 225 may implement hysteresis to improve stability of voltage transitions. A bootstrap diode BD has an anode terminal coupled to the input supply node VCC and a cathode terminal coupled to an output supply node to produce a bootstrap voltage VBOOT. An electrostatic discharge protection circuit 227 (ESD protection) has a first terminal coupled to the input ground node GND and a second terminal coupled to a power ground node GNDL to reciprocally protect the two ground rails (GND and GNDL) from electrostatic discharge (ESD). In addition to protecting from electrical discharges, the ESD protection circuit 227 decouples nodes GND and GNDL to protect node GND from voltage spikes caused by commutations of the power stage. The high-side output buffer circuit 224 drives a high-side GaN HEMT 24 (e.g., the gate terminal thereof). The low-side output buffer circuit 226 drives a low-side GaN HEMT 26 (e.g., the gate terminal thereof). The high-side HEMT 24 is coupled between a high-voltage supply pad VS and an output pad VOUT, and the low-side HEMT 26 is coupled between the output pad VOUT and the power ground pad GNDL, so that an output drive signal is produced at the output pad VOUT. A voltage regulator REGH (e.g., a low-dropout linear regulator) is arranged between the bootstrap line VBOOT and the output line VOUT (e.g., floating ground) and produces a regulated voltage VREGH (e.g., stable and invariant with respect to temperature and supply voltage VBOOT). The flip-flop FF and the high-side output buffer circuit 224 are supplied between the regulated voltage VREGH and the output voltage VOUT (e.g., floating ground). A voltage regulator REGL (e.g., a low-dropout linear regulator) is arranged between the supply line VCC and the power ground line GNDL and produces a regulated voltage VREGL (e.g., stable and invariant with respect to temperature and supply voltage VCC). The low-side intermediate buffer 225 and the low-side output buffer circuit 226 are supplied between the regulated voltage VREGL and the power ground voltage GNDL.

In one or more embodiments, the driver circuit 20 may be implemented as a fully monolithic GaN (e.g., GaN-on-Si) solution, i.e., with all the components implemented in a single GaN (e.g., GaN-on-Si) semiconductor die. Alternatively, as exemplified in FIG. 2, the driver circuit 20 may include a first GaN (e.g., GaN-on-Si) die 22 where the low-side components are implemented (e.g., buffers 220 and 221, regulator REGI, interlocking and protection circuit 222, level shifter 223, bootstrap diode BD, regulator REGL, ESD protection circuit 227, intermediate buffer 225, low-side output buffer 226 and low-side power switch 26) and a second (e.g., GaN-on-Si) die 23 where the high-side components are implemented (e.g., regulator REGH, flip-flop FF, high-side output buffer 224 and high-side power switch 24). Using two separate dice for the low-side and high-side components, respectively, facilitates reducing the body effect on the high-side power switch 24 and preventing common-mode noise from the substrate on the high-side gate driver during switching of the power stage.

FIG. 3 is a circuit block diagram exemplary of a possible implementation of the output buffers 224 and 226 for use in the circuit of FIG. 2.

Each output buffer 224, 226 includes a pre-buffer section and a push-pull buffer stage. The pre-buffer section contains four pre-buffer circuits, each of which drives an enhancement-mode transistor of the push-pull buffer stage, as further discussed in the following.

In particular, the output buffer has an input node 300 configured to receive a respective input signal in (e.g., the signal from flip-flop FF for buffer 224 or the signal from intermediate buffer 225 for buffer 226) and an output node 302 configured to produce an output gate driving signal gate (e.g., the signal applied to the gate terminal of power transistor 24 or 26, generally indicated as transistor QPE in FIG. 3).

The pre-buffer section includes a first high-side pre-buffer 31H coupled to node 300 to receive signal in, a high-side delay circuit 32H coupled to the output of pre-buffer 31H and configured to produce a delayed replica of the output signal from circuit 31H, a high-side AND logic gate 33H coupled to node 300 and to delay circuit 32H to apply AND logic processing to signal in and to the delayed signal from circuit 32H, and a second high-side pre-buffer 34H coupled to gate 33H to receive the output signal therefrom. The pre-buffer section also includes an inverter logic gate 301 coupled to node 300 and configured to produce the complement in of signal in, a first low-side pre-buffer 31L coupled to gate 301 to receive signal in, a low-side delay circuit 32L coupled to the output of pre-buffer 31L and configured to produce a delayed replica of the output signal from circuit 31L, a low-side AND logic gate 33L coupled to the output of inverter 301 and to delay circuit 32L to apply AND logic processing to signal in and to the delayed signal from circuit 32L, and a second low-side pre-buffer 34L coupled to gate 33L to receive the output signal therefrom. It will be noted that the same or similar operation may be obtained if delay circuit 32H receives signal in instead of the output from circuit 31H, and if delay circuit 32L receives signal in instead of the output from circuit 31L. However, the embodiments exemplified in FIG. 3 (where delay circuit 32H is coupled to the output of circuit 31H and delay circuit 32L is coupled to the output of circuit 31L) allow for a shorter delay being introduced by circuits 32H and 32L, insofar as the delay of circuits 32H, 32L is added to the delay introduced by circuits 31H and 31L.

The push-pull buffer stage of each output buffer 224, 226 includes a first switch QE1 (e.g., an enhancement-mode GaN transistor) having its current path arranged between a high supply node at voltage V+ (e.g., corresponding to voltage VREGH or VREGL) and the output node 302, and a control terminal coupled to the output of pre-buffer 31H to be driven thereby. For instance, transistor QE1 may have a source terminal coupled to node 302, a drain terminal coupled to supply node V+, and a gate terminal coupled to buffer 31H. A resistor R1 may be coupled in series to transistor QE1, e.g., between the drain of transistor QE1 and the supply node V+. The push-pull buffer stage includes a second switch QE2 (e.g., an enhancement-mode GaN transistor) having its current path arranged between the supply node V+ and the output node 302, and a control terminal coupled to the output of pre-buffer 34H to be driven thereby. For instance, transistor QE2 may have a source terminal coupled to node 302, a drain terminal coupled to supply node V+, and a gate terminal coupled to buffer 34H. The push-pull buffer stage includes a third switch QE3 (e.g., an enhancement-mode GaN transistor) having its current path arranged between the output node 302 and a low supply node at voltage V− (e.g., corresponding to voltage VOUT or GNDL), and a control terminal coupled to the output of pre-buffer 31L to be driven thereby. For instance, transistor QE3 may have a drain terminal coupled to node 302, a source terminal coupled to supply node V− (e.g., via a further switch), and a gate terminal coupled to buffer 31L. A further switch QSE (e.g., an enhancement-mode GaN transistor) may be coupled in series to transistor QE3, e.g., between the source of transistor QE3 and the supply node V−. For instance, transistor QSE may have a drain terminal coupled to the source terminal of transistor QE3, a source terminal coupled to supply node V− and a gate terminal coupled to the output node 302. Therefore, transistor QSE has its gate terminal coupled to the gate terminal of power transistor QPE and its source terminal coupled to the source terminal of power transistor QPE, so that transistor QSR reaches the turn-off threshold at the same time as transistor QPE. A resistor R3 may be coupled in parallel to the conductive channel of transistor QSE, e.g., between the drain and source terminals of transistor QSE. The push-pull buffer stage includes a fourth switch QE4 (e.g., an enhancement-mode GaN transistor) having its current path arranged between the supply node V– and the output node 302, and a control terminal coupled to the output of pre-buffer 34L to be driven thereby. For instance, transistor QE4 may have a drain terminal coupled to node 302, a source terminal coupled to supply node V–, and a gate terminal coupled to buffer 34L.

The architecture exemplified in FIG. 3 is conceived to drive rail-to-rail the respective power transistor QPE (i.e., transistor 24 or 26) in four different time steps or phases. During the turn-on phase, the gate terminal of power transistor QPE is charged via transistor QE1 with a current limited by resistor R1, to control the switching of transistor QPE with soft edges and reduced electromagnetic emissions. After a certain delay time (set by delay circuit 32H), the turn-on state is confirmed by transistor QE2, which keeps the gate of power transistor QPE to a high voltage (V+) with a lower impedance. During the turn-off phase, the gate terminal of power transistor QPE is discharged via transistor QE3 with a peak current in the signal transistor QSE and a controlled current limited by resistor R3. Transistor QSE is configured to quickly discharge the gate of power transistor QPE down to an off-threshold voltage value and, if it is matched with the power transistor, its contribution elapses before reaching such a threshold. Therefore, operation of transistor QSE does not affect the switching edges of power transistor QPE, which are controlled (only) by resistor R3. After a certain delay time (set by delay circuit 32L), the turn-off state is confirmed by transistor QE4, which keeps the gate of power transistor QPE to a low voltage (V–) with a lower impedance.

The pre-buffers 31H, 34H and 31L, 34L included in the gate driver differ on whether they drive transistors QE1 and QE2 or QE3 and QE4, even though the functionality is similar.

Figure 4:
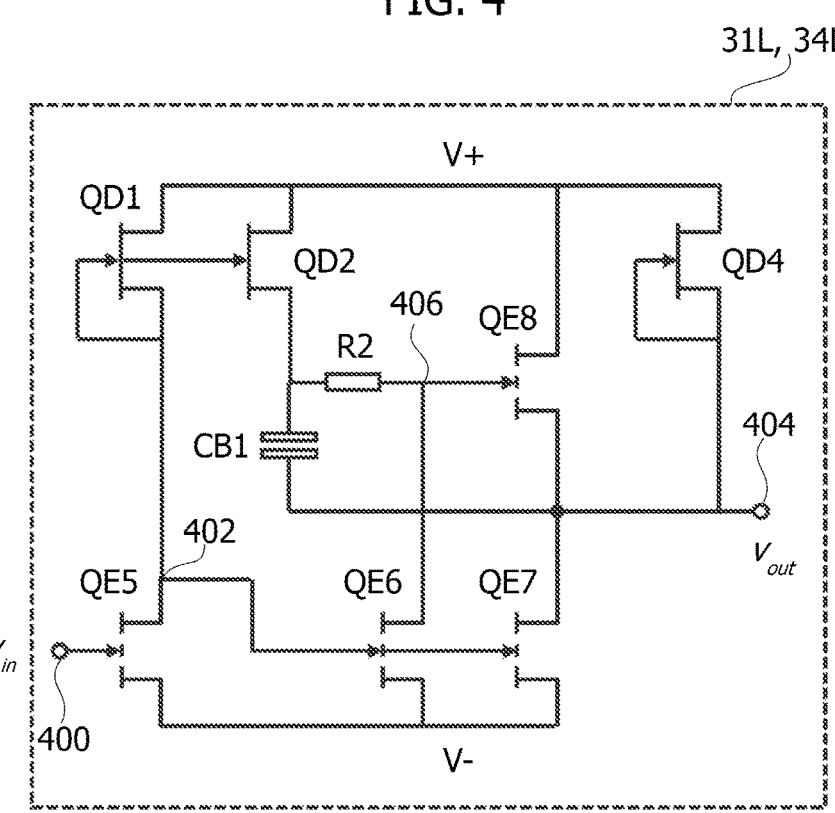
FIG. 4 is a circuit block diagram exemplary of a low-side pre-buffer stage in GaN technology according to one or more embodiments of the present description

FIG. 4 is a circuit diagram exemplary of a possible implementation of pre-buffers 31L and 34L. The pre-buffer has an input node 400 configured to receive an input signal $v_{in}$ (e.g., signal in or the output signal from gate 33L, see FIG. 3) and an output node 404 configured to produce a drive signal for one of the transistors of the push-pull stage (e.g., transistor QE3 or QE4). A depletion transistor QD1 and an enhancement transistor QE5 have their conductive channels arranged in series between a high supply voltage V+ (e.g., VREGH or VREGL) and a low supply voltage V– (e.g., VOUT or GNDL). For instance, transistor QE5 has a source terminal coupled to voltage V–, a drain terminal coupled to the source terminal of transistor QD1 at node 402, and a gate terminal coupled to node 400 to receive signal $v_{in}$, while transistor QD1 has a drain terminal coupled to voltage V+ and a gate terminal coupled to its source terminal at node 402. A depletion transistor QD2 and an enhancement transistor QE6 have their conductive channels arranged in series between the high supply voltage V+ and the low supply voltage V–. For instance, transistor QE6 has a source terminal coupled to voltage V–, a drain terminal coupled to a first terminal of a resistor R2, and a gate terminal coupled to node 402 intermediate transistors QE5 and QD1 (e.g., the drain of QE5 or source of QD1), while transistor QD2 has a first (e.g., alternatively drain or source) terminal coupled to voltage V+, a second (e.g., alternatively source or drain) terminal coupled to a second terminal of resistor R2, and a gate terminal coupled to the gate terminal of transistor QD1 to receive the same control signal. A bootstrap capacitor CB1 is coupled between the second terminal of transistor QD2 and the output node 404. An enhancement transistor QE8 has its conductive channel arranged between the high supply voltage V+ and the output node 404. For instance, transistor QE8 has a drain terminal coupled to voltage V+, a source terminal coupled to node 404 and a gate terminal coupled to the node 406 intermediate transistor QE6 and resistor R2 (e.g., the drain of QE6). An enhancement transistor QE7 has its conductive channel arranged between the output node 404 and the low supply voltage V–. For instance, transistor QE7 has a source terminal coupled to voltage V–, a drain terminal coupled to node 404 and a gate terminal coupled to the gate terminal of transistor QE6 to receive the same control signal. Optionally, a depletion transistor QD4 has its conductive channel arranged between the high supply voltage V+ and the output node 404. For instance, transistor QD4 has a drain terminal coupled to voltage V+, a source terminal coupled to node 404 and a gate terminal coupled to its source terminal (e.g., to node 404).

In the circuit of FIG. 4, when the input signal $v_{in}$ at node 400 is low, transistors QE5 and QE8 are off, while transistors QE6 and QE7 are on. Transistor QD1 has a pull-up function, complementary to transistor QE5. The bootstrap capacitor CB1 is charged via transistor QD2 up to voltage V+, while resistor R2 prevents capacitor CB1 from being discharged via transistor QE6. For better matching, resistor R2 may be replaced with a depletion-mode transistor. In this condition, the output signal $v_{out}$ is also low. When the input signal $v_{in}$ at node 400 goes high, transistor QE5 is turned on, while transistors QE6 and QE7 are turned off. Transistor QE8 is boosted on by capacitor CB1, and voltage $v_{out}$ at node 404 is pulled up to V+. Furthermore, transistor QD4 keeps the output node 404 at a high voltage even while capacitor CB1 is discharging, thus turning off transistor QE6.

Figure 5:
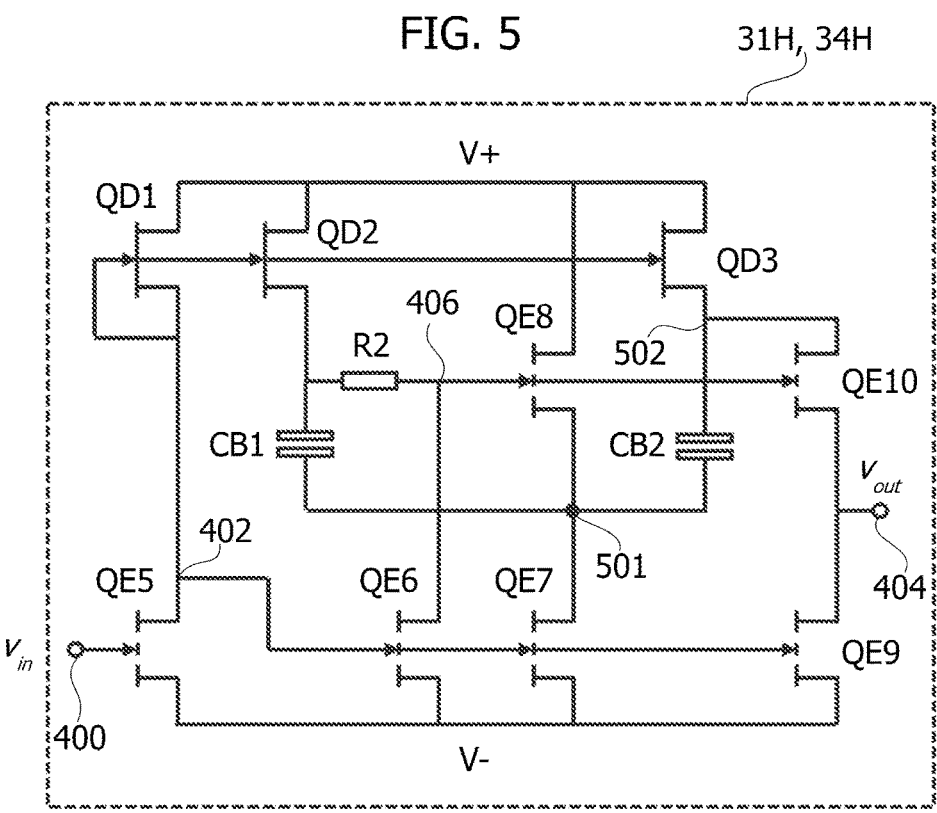
FIG. 5 is a circuit block diagram exemplary of a high-side pre-buffer stage in GaN technology according to one or more embodiments of the present description.

FIG. 5 is a circuit diagram exemplary of a possible implementation of pre-buffers 31H and 34H, which includes substantially the same components as illustrated in FIG. 4, whose description will not be repeated for brevity. Substantially, the pre-buffer of FIG. 5 differs from the pre-buffer of FIG. 4 in that the second terminal of capacitor CB1, the source terminal of transistor QE8 and the drain terminal of transistor QE7 are not connected to the output node 404 but to an intermediate node 501. Further, the circuit of FIG. 5 does not include transistor QD4. Further, the circuit of FIG. 5 includes a depletion transistor QD3 and a bootstrap capacitor CB2 arranged between the supply voltage V+ and the intermediate node 501. For instance, transistor QD3 has a first (e.g., alternatively drain or source) terminal coupled to voltage V+, a second (e.g., alternatively source or drain) terminal coupled to a first terminal of capacitor CB2 at node 502, and a gate terminal coupled to the gate terminals of transistors QD1 and QD2 to receive the same control signal, while capacitor CB2 has a second terminal coupled to node 501 (e.g., the source of QE8 or drain of QE7). Further, the circuit of FIG. 5 includes an enhancement transistor QE10 and an enhancement transistor QE9 having their conductive channels arranged in series between node 502 (e.g., a terminal of capacitor CB2) and the low supply voltage V–, and having the output node 404 therebetween. For instance, transistor QE10 has a drain terminal coupled to node 502, a source terminal coupled to the output node 404, and a gate terminal coupled to the gate terminal of transistor QE8 to receive the same control signal, while transistor QE9 has a drain terminal coupled to node 404, a source terminal coupled to voltage V− and a gate terminal coupled to the gate terminals of transistors QE6 and QE7 to receive the same control voltage.

In the circuit of FIG. 5, when the input signal $v_{in}$ at node 400 is low, transistors QE5, QE8 and QE10 are off, while transistors QE6, QE7 and QE9 are on. Transistor QD1 has a pull-up function, complementary to transistor QE5. The bootstrap capacitors CB1 and CB2 are charged, respectively, via transistors QD2 and QD3 up to voltage V+, while resistor R2 prevents capacitor CB1 from being discharged via transistor QE6. For better matching, resistor R2 may be replaced with a depletion-mode transistor. In this condition, the output signal $v_{out}$ is also low. When the input signal $v_{in}$ at node 400 goes high, transistor QE5 is turned on, while transistors QE6, QE7 and QE9 are turned off. Transistors QE8 and QE10 are boosted on by capacitor CB1, while the charge accumulated on capacitor CB2 is transferred through transistor QE10 to node 404 so that voltage $v_{out}$ at node 404 is pulled up to 2·V+.

Figure 6:
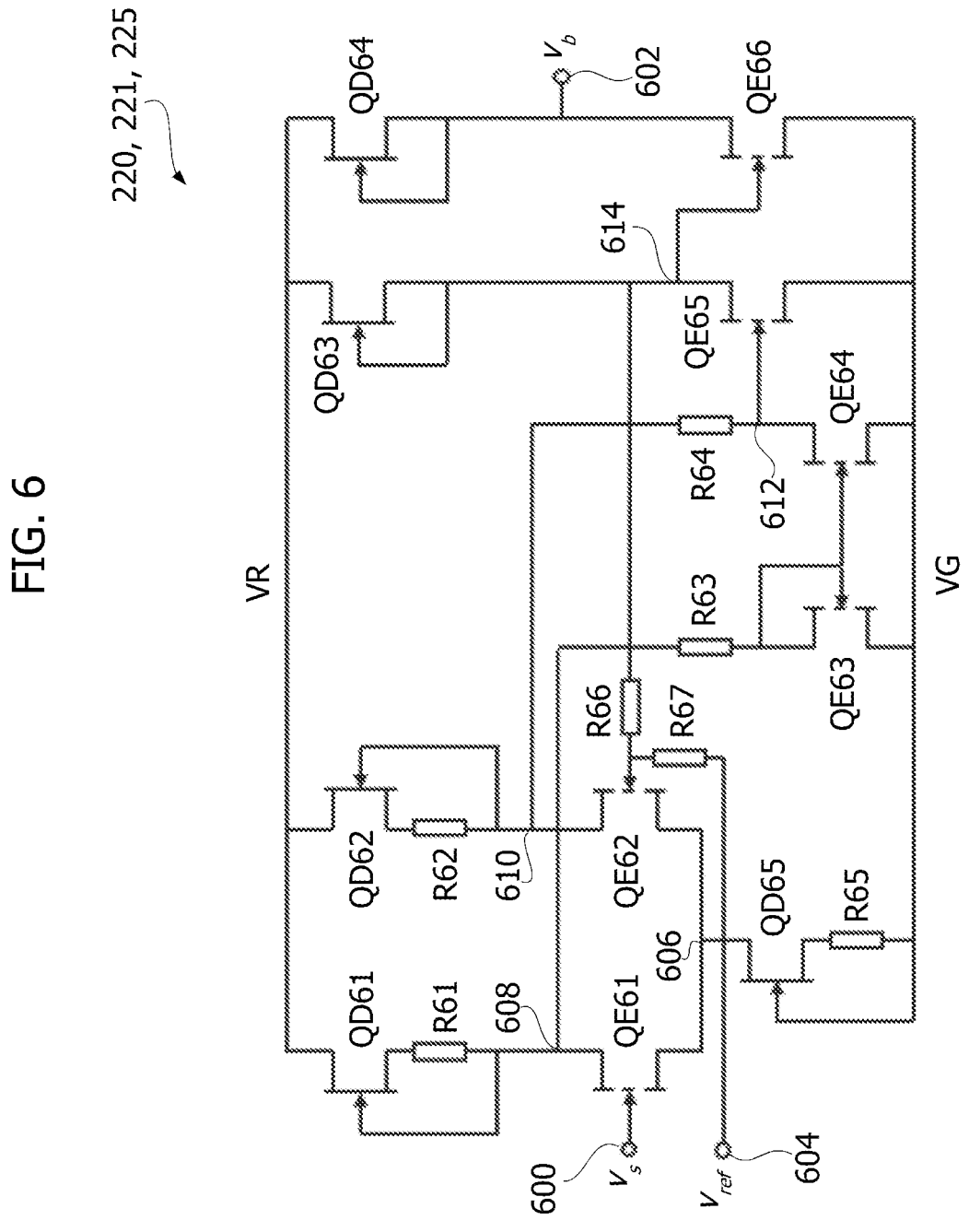
FIG. 6 is a circuit block diagram exemplary of a comparator circuit in GaN technology according to one or more embodiments of the present description.

FIG. 6 is a circuit block diagram exemplary of a possible implementation of the buffers 220, 221 and 225 (e.g., high-speed three-stage comparators with hysteresis) in GaN technology, for use in the circuit of FIG. 2.

Each comparator 220, 221, 225 includes an input stage, a differential-to-single-ended stage, and an output stage.

In particular, the comparator has an input node 600 configured to receive a respective input signal $v_s$ (e.g., signal VINH for comparator 220, signal VINL for comparator 221, or a signal output by circuit 222 for comparator 225, see FIG. 2), a reference node 604 configured to receive a reference voltage $v_{ref}$, and an output node 602 configured to produce a respective output signal $v_b$ (e.g., the two signals applied to circuit 222 by comparators 220 and 221, or the signal applied to the low-side output buffer 226 by comparator 225, see FIG. 2).

The input stage of the comparator includes a differential source-coupled pair of (well-matched) enhancement-mode transistors QE61 and QE62, a tail current generator including depletion-mode transistor QD65 and optionally resistor R65, and a pair of current generator loads including depletion-mode transistors QD61, QD62 and optionally resistors R61, R62. In particular, e-mode transistor QE61 has a gate terminal coupled to the input node 600 (e.g., the first input node of the differential pair), a source terminal coupled to node 606 (e.g., the tail node of the differential pair), and a drain terminal coupled to node 608 (e.g., the first output node of the differential pair). In particular, e-mode transistor QE62 has a gate terminal coupled to the reference node 604 (e.g., the second input node of the differential pair), optionally via a resistor R67, a source terminal coupled to node 606, and a drain terminal coupled to node 610 (e.g., the second output node of the differential pair). In particular, d-mode transistor QD61 has a drain terminal coupled to a supply node VR (e.g., the regulated voltage VREG for comparators 220 and 221, or the regulated voltage VREGL for comparator 225, see FIG. 2), a source terminal coupled to node 608, optionally via resistor R61, and a gate terminal coupled to node 608. In particular, d-mode transistor QD62 has a drain terminal coupled to supply node VR, a source terminal coupled to node 610, optionally via resistor R62, and a gate terminal coupled to node 610. In particular, d-mode transistor QD65 has a drain terminal coupled to node 606, a source terminal coupled to a ground node VG (e.g., ground node GND for comparators 220 and 221, or ground node GNDL for comparator 225, see FIG. 2), optionally via resistor R65, and a gate terminal coupled to ground node VG. The three current generators QD61, QD62, QD65 may be identical. Arranging resistors R61, R62 and R65 between the source and gate terminals of the respective d-mode transistors QD61, QD62 and QD65 increases the output resistance and reduces the current flowing through the differential pair (e.g., through the tail current generator) to a suitable value, e.g., around 20 μA.

The differential-to-single-ended stage of the comparator includes a current mirror including a pair of enhancement-mode transistor QE63, QE64 coupled to nodes 608, 610 optionally via resistors R63, R64. In particular, e-mode transistor QE63 has a drain terminal coupled to node 608, optionally via resistor R63, a source terminal coupled to the ground node VG, and a gate terminal coupled its drain terminal. In particular, e-mode transistor QE64 has a drain terminal coupled to node 610, optionally via resistor R64, a source terminal coupled to the ground node VG, and a gate terminal coupled the gate terminal of transistor QE63. Therefore, the current flowing through transistor QE63 is mirrored (optionally scaled) through transistor QE64. The current mirror QE63, QE64 folds and scales down the DC level of the differential signal taken at nodes 608, 610 and produces a single-ended signal at the drain terminal of transistor QE64, referred to as node 612.

The output stage of the comparator includes a pair of cascaded (identical) inverter circuits. The first inverter circuit receives the single-ended signal from node 612 and produces the complement thereof at node 614, and the second inverter circuit receives the complemented signal from node 614 and again produces the complement thereof at the output node 602, as output signal $v_b$. In particular, the first inverter circuit includes a d-mode transistor QD63 and an e-mode transistor QE65 having their conductive channels arranged in series between supply node VR and ground node VG. E-mode transistor QE65 has a source terminal coupled to ground node VG, a gate terminal coupled to node 612, and a drain terminal coupled to node 614. D-mode transistor QD63 has a source terminal coupled to node 614, a drain terminal coupled to supply node VR, and a gate terminal coupled to its source terminal. Further, the node 614 intermediate transistors QE65 and QD63 may be coupled, optionally via resistor R66, to the gate terminal of transistor QE62 to receive the reference voltage $v_{ref}$. In particular, the second inverter circuit includes a d-mode transistor QD64 and an e-mode transistor QE66 having their conductive channels arranged in series between supply node VR and ground node VG. E-mode transistor QE66 has a source terminal coupled to ground node VG, a gate terminal coupled to node 614, and a drain terminal coupled to the output node 602. D-mode transistor QD64 has a source terminal coupled to node 602, a drain terminal coupled to supply node VR, and a gate terminal coupled to its source terminal. The output signal $v_b$ is produced at node 602 intermediate transistors QE66 and QD64. It is noted that resistors R66 and R67 may be used to generate voltage hysteresis through positive feedback connected to the reference voltage $v_{ref}$.

It will be noted that, while having been described herein within the context of a fully integrated GaN driver circuit 20, embodiments of comparators implemented in GaN technology as discussed with reference to FIG. 6 are innovative per se and may be applied to other GaN integrated circuits, and could form the subject of one or more embodiments independently from their inclusion in a gate driver device as exemplified in FIG. 2.

One or more embodiments as exemplified herein may thus provide one or more of the following advantages:

a high-speed and low-power gate driver, implemented in a monolithic smart power GaN technology, able to drive a power transistor, both entirely integrated in the same substrate;

ability to control the switching edges and to reduce the electromagnetic emissions;

ability to drive rail-to-rail the gate of the power transistor; and reduced power consumption in high-speed switching.

A buffer circuit (224, 226) for driving a Gallium Nitride, GaN, power switch (QPE), the buffer circuit (224, 226), may be summarized as including: an input node (300) configured to receive an input signal (in); an output node (302) configured to produce a gate signal (gate) for said GaN power switch (QPE); a push-pull stage, including: a first transistor (QE1) having its conductive channel coupled between a supply voltage node (V+) and said output node(302); a second transistor (QE2) having its conductive channel coupled between said supply voltage node (V+) and said output node(302); a third transistor (QE3) having its conductive channel coupled between said output node(302) and a reference voltage node (V−); and a fourth transistor (QE4) having its conductive channel coupled between said output node(302) and said reference voltage node (V−); and a pre-buffer stage configured to receive said input signal (in) and to produce respective driving signals for said first (QE1), second (QE2), third (QE3) and fourth (QE4) transistors to produce said gate signal (gate) at said output node (302) in four consecutive phases, wherein: in a first phase, said first transistor (QE1) is conductive, and said second (QE2), third (QE3) and fourth (QE4) transistors are not conductive; in a second phase, said first (QE1) and second (QE2) transistors are conductive, and said third (QE3) and fourth (QE4) transistors are not conductive; in a third phase, said third transistor (QE3) is conductive, and said first (QE1), second (QE2) and fourth (QE4) transistors are not conductive; and in a fourth phase, said third (QE3) and fourth (QE4) transistors are conductive, and said first (QE1) and second (QE2) transistors are not conductive.

Said push-pull stage may further include: a first resistor (R1) arranged in series to the conductive channel of said first transistor (QE1); and a fifth transistor (QSE) coupled in parallel to a second resistor (R3), the fifth transistor (QSE) and second resistor (R3) being jointly arranged in series to the conductive channel of said third transistor (QE3), wherein the fifth transistor (QSE) is controlled by said gate signal (gate).

Said first (QE1), second (QE2), third (QE3), fourth (QE4) and fifth (QSE) transistors may be enhancement-mode GaN transistors.

Said pre-buffer stage may include: a first pre-buffer (31H) configured to drive said first transistor (QE1) as a function of said input signal (in); a first delay and logic circuit (32H, 33H) configured to produce a replica of said input signal (in), said replica having rising edges delayed with respect to the rising edges of said input signal (in); a second pre-buffer (34H) configured to drive said second transistor (QE2) as a function of said replica of said input signal (in); a third pre-buffer (31L) configured to drive said third transistor (QE3) as a function of the complement (in) of said input signal (in); a second delay and logic circuit (32L, 33L) configured to produce a replica of the complement (in) of said input signal (in), said replica having rising edges delayed with respect to the rising edges of the complement (in) of said input signal (in); and a fourth pre-buffer (34L) configured to drive said fourth transistor (QE4) as a function of said replica of the complement (in) of said input signal (in).

Said first pre-buffer (31H) and/or said second pre-buffer (34H) may include: a respective input node (400) configured to receive a respective input signal ($v_{in}$) and a respective output node (404) configured to produce a respective driving signal ($v_{out}$); a first depletion transistor (QD1) and a first enhancement transistor (QE5) having their conductive channels arranged in series between said supply voltage node (V+) and said reference voltage node (V−), wherein a gate terminal of said first enhancement transistor (QE5) is coupled to said respective input node (400); a second depletion transistor (QD2) and a second enhancement transistor (QE6) having their conductive channels arranged in series between said supply voltage node (V+) and said reference voltage node (V−), wherein a gate terminal of said second depletion transistor (QD2) is coupled to a gate terminal of said first depletion transistor (QD1) and a gate terminal of said second enhancement transistor (QE6) is coupled to a node (402) intermediate said first depletion transistor (QD1) and said first enhancement transistor (QE5); a first bootstrap capacitor (CB1) coupled between a source terminal of said second depletion transistor (QD2) and a bootstrap node (501); a third enhancement transistor (QE8) having its conductive channel arranged between said supply voltage node (V+) and said bootstrap node (501), and a gate terminal coupled to a drain terminal of said second enhancement transistor (QE6); a fourth enhancement transistor (QE7) having its conductive channel arranged between said bootstrap node (501) and said reference voltage node (V−), and a gate terminal coupled to the gate terminal of said second enhancement transistor (QE6); a third depletion transistor (QD3) and a second bootstrap capacitor (CB1) arranged in series between said supply voltage node (V+) and said bootstrap node (501), wherein a gate terminal of said third depletion transistor (QD3) is coupled to a gate terminal of said first depletion transistor (QD1) and a first terminal of said second bootstrap transistor (CB2) is coupled to said bootstrap node (501); and a fifth enhancement transistor (QE10) and a sixth enhancement transistor (QE9) having their conductive channels arranged in series between a second terminal (502) of said second bootstrap transistor (CB2) and said reference voltage node (V−), wherein a gate terminal of said fifth enhancement transistor (QE10) is coupled to the gate terminal of said third enhancement transistor (QE8) and a gate terminal of said sixth enhancement transistor (QE9) is coupled to the gate terminal of said fourth enhancement transistor (QE7), wherein said respective output node (404) is between said fifth (QE10) and a sixth (QE9) enhancement transistors.

Said third pre-buffer (31L) and/or said fourth pre-buffer (34L) may include: a respective input node (400) configured to receive a respective input signal ($v_{in}$) and a respective output node (404) configured to produce a respective driving signal ($v_{out}$); a first depletion transistor (QD1) and a first enhancement transistor (QE5) having their conductive channels arranged in series between said supply voltage node (V+) and said reference voltage node (V−), wherein a gate terminal of said first enhancement transistor (QE5) is coupled to said respective input node (400); a second depletion transistor (QD2) and a second enhancement transistor (QE6) having their conductive channels arranged in series between said supply voltage node (V+) and said reference voltage node (V−), wherein a gate terminal of said second depletion transistor (QD2) is coupled to a gate terminal of said first depletion transistor (QD1) and a gate terminal of said second enhancement transistor (QE6) is coupled to a node (402) intermediate said first depletion transistor (QD1) and said first enhancement transistor (QE5); a bootstrap capacitor (CB1) coupled between a source terminal of said second depletion transistor (QD2) and said respective output node (404); a third enhancement transistor (QE8) having its conductive channel arranged between said supply voltage node (V+) and said respective output node (404), and a gate terminal coupled to a drain terminal of said second enhancement transistor (QE6); and a fourth enhancement transistor (QE7) having its conductive channel arranged between said respective output node (404) and said reference voltage node (V−), and a gate terminal coupled to the gate terminal of said second enhancement transistor (QE6).

Said third pre-buffer (31L) and/or said fourth pre-buffer (34L) may include a third depletion transistor (QD4) having its conductive channel arranged between said supply voltage node (V+) and said respective output node (404), and a gate terminal coupled to its source terminal.

A driver circuit (20), may be summarized as including: an input supply pad configured to receive a supply voltage (VCC), an input ground pad configured to receive a ground voltage (GND), an input high-side control pad configured to receive a high-side control signal (VINH), an input low-side control pad configured to receive a low-side control signal (VINL), and an output pad configured to produce an output driving signal (VOUT); a level shifter (223) configured to shift and pass said high-side control signal (VINH) to a high-side output buffer circuit (224) according to any of the previous claims; a low-side intermediate buffer circuit (225) configured to pass said low-side control signal (VINL) to a low-side output buffer circuit (226) according to any of the previous claims; a high-side GaN power transistor (24) arranged between a high-voltage supply pad (VS) and said output pad (VOUT) and driven by said high-side output buffer circuit (224); and a low-side GaN power transistor (26) arranged between said output pad (VOUT) and a protected ground pad (GNDL) and driven by said low-side output buffer circuit (226).

Said level shifter (223), said high-side output buffer circuit (224), said low-side intermediate buffer circuit (225), said low-side output buffer circuit (226), said high-side GaN power transistor (24) and said low-side GaN power transistor (26) may be implemented in a single GaN semiconductor substrate, preferably a Gan-on-Si semiconductor substrate.

Said level shifter (223), said low-side intermediate buffer circuit (225), said low-side output buffer circuit (226) and said low-side GaN power transistor (26) may be implemented in a first GaN semiconductor substrate, preferably a Gan-on-Si semiconductor substrate; and said high-side output buffer circuit (224) and said high-side GaN power transistor (24) may be implemented in a second GaN semiconductor substrate, preferably a Gan-on-Si semiconductor substrate.

The driver circuit (20) may further include: a first voltage regulator (REGL) configured to produce a first regulated voltage (VREGL) as a function of said supply voltage (VCC); bootstrap circuitry (BD) configured to produce a bootstrap voltage (VBOOT) as a function of said supply voltage (VCC); and a second voltage regulator (REGH) configured to produce a second regulated voltage (VREGH) as a function of said bootstrap voltage (VBOOT), wherein said low-side output buffer circuit (226) may be supplied by said first regulated voltage (VREGL) and said high-side output buffer circuit (224) may be supplied by said second regulated voltage (VREGH).

Said low-side intermediate buffer circuit (225) may include an input stage, a differential-to-single-ended stage, and an output stage, wherein said input stage may include: an input differential pair of transistors (QE61, QE62), a first transistor (QE61) of the pair being configured to receive an input signal ($v_s$) at a control terminal thereof, and a second transistor (QE62) of the pair being configured to receive a reference signal ($v_{ref}$) at a control terminal thereof; a first current generator load (QD61, R61) coupled between said first transistor (QE61) and a supply node (VR) of the low-side intermediate buffer circuit (225); a second current generator load (QD62, R62) coupled between said second transistor (QE62) and said supply node (VR) of the low-side intermediate buffer circuit (225); and a tail current generator (QD65, R65) coupled between a tail node (606) of said input differential pair of transistors (QE61, QE62) and a ground node (VG) of the low-side intermediate buffer circuit (225); and wherein said differential-to-single-ended stage may include a current mirror arrangement (QE63, QE64) coupled to first (608) and second (610) output nodes of said input differential pair of transistors (QE61, QE62); and wherein said output stage may include a pair of cascaded inverter circuits, the first inverter circuit (QE65, QD63) being configured to receive a single-ended signal from an output node of said differential-to-single-ended stage, and the second inverter circuit (QE66, QD64) being configured to receive a complemented signal from an output node of said first inverter circuit to produce an output signal ($v_b$) of the low-side intermediate buffer circuit (225).

Without prejudice to the underlying principles, the details and embodiments may vary, even significantly, with respect to what has been described by way of example only, without departing from the extent of protection.

The various embodiments described above can be combined to provide further embodiments. All of the non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A driver circuit, comprising:

an input supply pad configured to receive a supply voltage, an input ground pad configured to receive a ground voltage, an input high-side control pad configured to receive a high-side control signal, an input low-side control pad configured to receive a low-side control signal, and an output pad configured to produce an output driving signal;

a high-side output buffer circuit;

a low-side output buffer circuit;

a level shifter configured to shift and pass the high-side control signal to the high-side output buffer circuit;

a low-side intermediate buffer circuit configured to pass the low-side control signal to the low-side output buffer circuit;

a high-side GaN power transistor arranged between a high-voltage supply pad and the output pad and driven by the high-side output buffer circuit;

a low-side GaN power transistor arranged between the output pad and a protected ground pad and driven by the low-side output buffer circuit;

a first voltage regulator configured to produce a first regulated voltage as a function of the supply voltage;

bootstrap circuitry configured to produce a bootstrap voltage as a function of the supply voltage; and a second voltage regulator configured to produce a second regulated voltage as a function of the bootstrap voltage, wherein the low-side output buffer circuit is supplied by the first regulated voltage and the high-side output buffer circuit is supplied by the second regulated voltage.

2. The driver circuit of claim 1, wherein the level shifter, the high-side output buffer circuit, the low-side intermediate buffer circuit, the low-side output buffer circuit, the high-side GaN power transistor and the low-side GaN power transistor are implemented in a single GaN semiconductor substrate.

3. The driver circuit of claim 2, wherein the GaN semiconductor substrate is a GaN-on-Si semiconductor substrate.

4. The driver circuit of claim 1, wherein:

the level shifter, the low-side intermediate buffer circuit, the low-side output buffer circuit and the low-side GaN power transistor are implemented in a first GaN semiconductor substrate; and the high-side output buffer circuit and the high-side GaN power transistor are implemented in a second GaN semiconductor substrate.

5. The driver circuit of claim 4, wherein the first and second GaN semiconductor substrates are GaN semiconductor substrates.

6. A driver circuit, comprising:

an input supply pad configured to receive a supply voltage, an input ground pad configured to receive a ground voltage, an input high-side control pad configured to receive a high-side control signal, an input low-side control pad configured to receive a low-side control signal, and an output pad configured to produce an output driving signal;

a high-side output buffer circuit;

a low-side output buffer circuit;

a level shifter configured to shift and pass the high-side control signal to the high-side output buffer circuit;

a low-side intermediate buffer circuit configured to pass the low-side control signal to the low-side output buffer circuit;

a high-side GaN power transistor arranged between a high-voltage supply pad and the output pad and driven by the high-side output buffer circuit;

a low-side GaN power transistor arranged between the output pad and a protected ground pad and driven by the low-side output buffer circuit, wherein the low-side intermediate buffer circuit includes an input stage, a differential-to-single-ended stage, and an output stage, wherein the input stage includes:

an input differential pair of transistors, a first transistor of the pair being configured to receive an input signal at a control terminal thereof, and a second transistor of the pair being configured to receive a reference signal at a control terminal thereof;

a first current generator load coupled between the first transistor and a supply node of the low-side intermediate buffer circuit;

a second current generator load coupled between the second transistor and the supply node of the low-side intermediate buffer circuit; and a tail current generator coupled between a tail node of the input differential pair of transistors and a ground node of the low-side intermediate buffer circuit;

and wherein the differential-to-single-ended stage includes a current mirror arrangement coupled to first and second output nodes of the input differential pair of transistors;

and wherein the output stage includes a pair of cascaded inverter circuits, the first inverter circuit being configured to receive a single-ended signal from an output node of the differential-to-single-ended stage, and the second inverter circuit being configured to receive a complemented signal from an output node of the first inverter circuit to produce an output signal of the low-side intermediate buffer circuit.

7. The driver circuit of claim 6, wherein the level shifter, the high-side output buffer circuit, the low-side intermediate buffer circuit, the low-side output buffer circuit, the high-side GaN power transistor and the low-side GaN power transistor are implemented in a single GaN semiconductor substrate.

8. The driver circuit of claim 7, wherein the GaN semiconductor substrate is a GaN-on-Si semiconductor substrate.

9. The driver circuit of claim 6, wherein:

the level shifter, the low-side intermediate buffer circuit, the low-side output buffer circuit and the low-side GaN power transistor are implemented in a first GaN semiconductor substrate; and the high-side output buffer circuit and the high-side GaN power transistor are implemented in a second GaN semiconductor substrate.

10. The driver circuit of claim 9, wherein the first and second GaN semiconductor substrates are GaN semiconductor substrates.

11. The driver circuit of claim 6, further comprising:

a first voltage regulator configured to produce a first regulated voltage as a function of the supply voltage;

bootstrap circuitry configured to produce a bootstrap voltage as a function of the supply voltage; and a second voltage regulator configured to produce a second regulated voltage as a function of the bootstrap voltage, wherein the low-side output buffer circuit is supplied by the first regulated voltage and the high-side output buffer circuit is supplied by the second regulated voltage.

* * * * *